United States Patent
Katscher et al.

(10) Patent No.: US 6,828,790 B2
(45) Date of Patent: Dec. 7, 2004

(54) MAGNETIC RESONANCE APPARATUS WITH EXCITATION ANTENNAE SYSTEM

(75) Inventors: Ulrich Katscher, Norderstedt (DE); Peter Boernert, Hamburg (DE); Johan Samuel van den Brink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/224,049

(22) Filed: Aug. 20, 2002

(65) Prior Publication Data

US 2003/0102866 A1 Jun. 5, 2003

(30) Foreign Application Priority Data

Aug. 21, 2001 (EP) .............................................. 01203153

(51) Int. Cl.[7] .............................. G01V 3/00; H01P 7/00
(52) U.S. Cl. .................................... 324/318; 333/219.2
(58) Field of Search ................................ 324/309, 307, 324/318, 322; 600/422; 333/219.2

(56) References Cited

U.S. PATENT DOCUMENTS

| | | | | |
|---|---|---|---|---|
| 5,910,728 | A | * | 6/1999 | Sodickson .................. 324/309 |
| 6,289,232 | B1 | * | 9/2001 | Jakob et al. ................. 600/410 |
| 6,377,045 | B1 | * | 4/2002 | Van Den Brink et al. .. 324/307 |
| 6,518,760 | B2 | * | 2/2003 | Fuderer et al. ............. 324/307 |
| 6,556,010 | B2 | * | 4/2003 | Van Den Brink et al. .. 324/309 |
| 6,593,740 | B1 | * | 7/2003 | Van Den Brink et al. .. 324/307 |
| 2002/0011845 | A1 | * | 1/2002 | Van Den Brink et al. .. 324/322 |
| 2002/0039024 | A1 | * | 4/2002 | Fuderer et al. ............. 324/307 |
| 2003/0057946 | A1 | * | 3/2003 | Shah et al. ................. 324/307 |
| 2003/0102866 | A1 | * | 6/2003 | Katscher et al. ............ 324/318 |
| 2003/0122545 | A1 | * | 7/2003 | Van Den Brink et al. .. 324/309 |

FOREIGN PATENT DOCUMENTS

WO    WO 200196896 A1 * 12/2001    ............ G01V/3/00

OTHER PUBLICATIONS

Lawrence P. Panych, et al.; "Selection of High–Definition 2D Virtual Profiles With Multiple RF Pulse Excitations Along Interleaved Echo–Planar k–Space Trajectories"; Magnetic Resonance in Medicine, vol. 41, 1999, pp. 224–229.

V. Andrew Stenger, et al.; "Multi–Shot Three–Dimensional Tailored RF Slice–Select Pulses"; Proceedings of International Society of Magnetic Resonance, 2001, p. 347.

Klaas P. Pruessmann, et al.; "SENSE: Sensitivity Encoding for Fast MRI"; Magnetic Resonance in Medicine, vol. 42, 1999, pp. 952–962.

John Pauly, Dwight Nishimura, Albert Macovski, "A k–Space Analysis of Small–Tip–Angle Excitation"; Journal of Magnetic Resonance 81, pp. 43–56 (1989).

\* cited by examiner

*Primary Examiner*—Brij Shrivastav
*Assistant Examiner*—Tiffany Fetzner
(74) *Attorney, Agent, or Firm*—Thomas M. Lundin

(57) ABSTRACT

A magnetic resonance imaging system comprises an excitation antennae system (13,16) including several antennae for emitting an RF-excitation field [$B_1(t)$]. An activation control unit (ACU) is coupled to the excitation antennae system to activate the excitation antennae system. Individual antennae are activated to simultaneously emit separate RF-excitation constituents [$B_n(t)$]. The RF-excitation constituents have different activation distributions over k-space. and the time required for the RF-excitation is short even for complex spatial excitation patterns.

5 Claims, 4 Drawing Sheets

MAGNETIC RESONANCE APPARATUS WITH EXCITATION ANTENNAE SYSTEM

BACKGROUND

The invention pertains to a magnetic resonance imaging system comprising an excitation antennae system including several antennae for emitting an RF-excitation field [$B_1(t)$], an activation control unit coupled to the excitation antennae system and arranged for activating the excitation antennae system.

Such a magnetic resonance imaging system is known from the paper 'A k-space analysis of small-tip-angle excitation' by John Pauly et al. in the Journal of Magnetic Resonance 81(1989)43–56.

The cited reference proposes to employ spatially selective RF-excitations in the magnetic resonance imaging system. Such spatially selective RF-excitations are achieved by scanning the applied RF-energy across k-space. Notably, the cited reference shows that inherent focussing of slice selection RF-excitations is achieved and also that spatially selective RF-excitations in two-dimensions are achieved.

However, the scanning of k-space as proposed in the cited reference leads to the need of applying complicated and lengthy sequences of temporary magnetic gradient fields and RF-excitation pulses. Consequently, the known spatially selective RF-excitations are time consuming and impede the formation of magnetic resonance images in rapid succession.

SUMMARY

An object of the invention is to provide a magnetic resonance imaging system which requires less time to achieve the RF-excitation. In particular, an object of the invention is to reduce the time required for spatially selective RF-excitations.

This object is achieved by the magnetic resonance imaging system according to the invention wherein the activation control system is arranged such that: individual antennae are activated to simultaneously emit separate RF-excitation constituents [$B_n(t)$]; and RF-excitation constituents having different activation distributions over k-space.

The magnetic resonance imaging system according to the invention produces magnetic resonance signals from which a magnetic resonance image is reconstructed. The magnetic resonance imaging system comprises a magnet system which provides a substantially uniform main magnetic field. The object to be examined is placed in the main magnetic field. The magnetic resonance signals are generated upon the RF-excitation. The RF-excitation causes magnetic spins in the object to be examined to be excited and subsequently these magnetic spins relax while emitting the magnetic resonance signals. The magnetic resonance signals are spatially encoded by application of temporary magnetic gradients, notably the so-called phase-encoding gradients and read-gradients provide the spatial encoding of the magnetic resonance signals. Also temporary magnetic gradient fields may be applied during the RF-excitation so as to bring about the scanning the applied RF-energy across k-space i.e. scanning the wavevector of the RF-excitation. The temporary magnetic gradient fields, also indicated as gradient pulses, are superposed on the main magnetic field applied by the magnet system. Usually gradient coils are employed to provide the gradient pulses. The RF-excitations are applied by the antennae system having one or several antennae. Preferably, RF-coils are employed as these antennae.

The activation unit of the magnetic resonance imaging system according to the invention performs a decomposition of the complete time-varying magnetic excitation field into several RF-excitation constituents. Separate RF-excitation constituents are emitted by respective antennae or RF-coils simultaneously. Thus it is achieved to perform the RF-excitation to a large degree in parallel. The degree of parallelism involved depends on the number of RF-excitation constituents employed. Consequently, the time required to apply the RF-excitation is accordingly reduced. Notably, the magnetic resonance imaging system of the invention makes more efficient use of the time available for the RF-excitation so that less time is needed to perform the excitation or a more complicated RF-excitation may be employed still within an acceptable period of time. The magnetic resonance imaging system according to the invention is suitable in particular for RF excitation of regions of intricate shapes.

These and other aspects of the invention will be further elaborated with reference to the embodiments defined in the dependent claims.

Preferably, the RF-excitation constituents contribute to the RF-excitation field according to the decomposition into harmonic components of the spatial RF-emission profiles of the individual antennae.

According to the invention, spatial encoding is employed by both gradient encoding and encoding on the basis of the spatial RF-emission profile of the RF-excitation coil. Thus, the excitation requires a more simple excitation sequence which is relatively short and achieves an accurate excitation of the required region. In practice this is achieved as follows:

1. Determine the spatial region to be excited.
2. Deform this region into 'folded' regions in which pixels are superpositions of pixels i.e. local RF-excitations levels, of the original spatial region to be excited and which superposition is encoded (weighted) on the basis of the spatial RF-emission profiles of the excitation antennae. These 'folded' regions form aliased spatial RF-emission profiles for the individual antennae. The superpositions are such that upon combination, e.g. adding, of the folded regions, overall RF-excitations due to the combined RF-excitation constituents cancel except in the pre-determined spatial region.
3. Perform a Fast Fourier transform to the folded region to derive the excitation waveforms which forming the RF-excitations constituents for each of the RF-coils involved together with the gradient pulses that cause the scanning across k-space.

Note that simultaneously applied RF-excitation constituents by excited RF-coils are activated while the same gradient pulse are applied. Hence, no additional time is required to apply different gradient pulses during simultaneous RF-excitation constituents. Simultaneous RF-excitation constituents are associated with the same traversal through k-space, i.e. contribute to the k-space trajectories simultaneously, but with possibly different amplitudes.

One embodiment of the magnetic resonance imaging system of the invention employs RF-excitation constituents each having different supports on k-space. The support on k-space of this RF-excitation constituent is the set of wavevectors (k-vector values) for which the RF-excitation constituent has a non-zero complex value. This embodiment employs excitation antennae, notably RF-coils, having a spatial sinusoidal spatial RF-emission profile.

In a preferred embodiment of a magnetic resonance imaging system according to the invention, the RF-excitation constituents have activation distributions over k-space that cause a sub-scanning of k-space along a sub-scanning direction. The term sub-scanning indicates that a less dense scanning of k-space than what is required in view of the spatial resolution of the spatial region to be excited, is carried-out by the RF-excitation constituent at issue. The computation of the RF-excitation constituents involves matrix inversion that is more stable as the predominant spatial variation of the spatial RF-emission profiles of the excitation antennae is along the sub-scanning direction.

Preferably, RF-surface coils are employed as the antennae of which the spatial RF-emission profile has emission phase changes mainly in the plane of the RF-surface coils. The RF-surface coils are substantially planar. Preferably respective RF-surface coils have their planes separated along the read-direction. In this formation, the RF-surface coil emission phases varies predominantly in the phase-encoding direction, viz. parallel to the plane of the RF-surface coil and the emission amplitude varies mainly along the read-direction transversely to the RF-surface coil plane. In this situation the computation of the RF-excitation constituents in particular for Cartesian trajectories involves a more stable matrix inversion. The matrix inversion can be stabilised by using adequate k-space trajectories and adequately designed and positioned coils. As a general rule, the trajectories should cover the k-space as smoothly as possible, and the coils should have (as good as possible) sinusoidal phase in the sub-scanning direction in which the density of scanned positions in k-space is lower, i.e., in the phase-encoding or preparation direction for Cartesian, in radial direction for spiral, and in tangential direction for radial trajectories.

The invention further relates to a magnetic resonance imaging method. The magnetic resonance imaging method according to the invention makes more efficient use of the time available for the RF-excitation so that less time is needed to perform the excitation or a more complicated RF-excitation may be employed still within an acceptable period of time. The magnetic resonance imaging method according to the invention is in particular well employed to perform intricate shaped spatially shaped regions.

The invention further relates to a computer programme. The computer programme is in particular suitable to carry out the magnetic resonance imaging method of the invention. Further, a magnetic resonance imaging system according to the invention can be provided by loading the computer programme according to the invention into the working memory of a computer incorporated in a general conventional magnetic resonance imaging system. The computer programme can be provided on a data carrier, such as a CD-rom and the computer programme can also be provided via a data network, such as the world-wide web, via which data network the computer programme according to the invention can be downloaded into the working memory of the computer of the magnetic resonance imaging system.

DRAWINGS

These and other aspects of the invention will be elucidated with reference to the embodiments described hereinafter and with reference to the accompanying drawing wherein FIG. 1 shows diagrammatically a magnetic resonance imaging system in which the invention is used.

FIG. 2 graphically shows input spatial RF-emission profiles of the method according to the invention FIG. 3 graphically shows calculated individual waveforms and corresponding pulse profiles used in the method of the invention FIG. 4 graphically shows individual pulse profiles transmitted (in the framework a numerical simulation) with the corresponding coils in the image domain and in the Fourier domain.

DESCRIPTION

FIG. 1 shows diagrammatically a magnetic resonance imaging system in which the invention is used. The magnetic resonance imaging system includes a set of main coils 10 whereby the steady, uniform magnetic field is generated. The main coils are constructed, for example in such a manner that they enclose a tunnel-shaped examination space. The patient to be examined is slid into this tunnel-shaped examination space. The magnetic resonance imaging system also includes a number of gradient coils 11, 12 whereby magnetic fields exhibiting spatial variations, notably in the form of temporary magnetic gradient fields in individual directions, are generated so as to be superposed on the uniform magnetic field. The temporary gradient fields serve to spatially encode the magnetic resonance signals and also to scan the RF-energy during RF-excitation across k-space. In particular, the temporary gradient fields are applied along the read direction and along the phase-encode direction. The gradient coils 11, 12 are connected to a controllable power supply unit 21. The gradient coils 11, 12 are energised by application of an electric current by means of the power supply unit 21. The strength, direction and duration of the gradients are controlled by control of the power supply unit. The magnetic resonance imaging system also includes transmission and receiving coils 13, 16 for generating the RF-excitation pulses and for picking up the magnetic resonance signals, respectively. The excitation antennae system 13, 16 preferably includes a set of surface coils 16, whereby (a part of) the object to be examined can be enclosed. The same set of surface coils or antennae system is usually used alternately as the transmission coil and the receiving coil. The transmission and receiving coil is for example implemented as a multi-channel or 'synergy' coil. Such 'synergy' coils are of advantage in cases where a large field-of-view and a relatively small penetration depth are needed. Furthermore, the transmission and receiving coil is usually shaped as a coil, but other geometries where the transmission and receiving coil acts as a transmission and receiving antenna for RF electromagnetic signals are also feasible. The transmission and receiving coil system 16 is connected to an electronic transmission and receiving circuit 15.

Such surface coils have a high emission in a comparatively small volume. The RF-coils, such as the surface coils, act as a transmission and receiving antenna for RF electromagnetic signals and are connected to a demodulator 24 and the received magnetic resonance signals (MS) are demodulated by means of the demodulator 24.

In addition the transmission and receiving coils include a body coil 13. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF-excitation pulses and RF-refocusing pulses. Preferably, the body coil 13 involves a spatially uniform intensity distribution of the transmitted RF-pulses (RFS). The body coil is advantageously used to determine the spatial RF-emission profiles of the surface coils. Further, the body coil 13 is conveniently combined with surface coils having harmonic (sinusoidal) spatial RF-emission profiles, since the body coil inherently has a harmonic spatial RF-emission profile at very low or zero spatial frequency.

The demodulated magnetic resonance signals (DMS) are applied to a reconstruction unit. The receiving coil is connected to a preamplifier 23. The preamplifier 23 amplifies the RF-resonance signal (MS) received by the receiving coil 16 and the amplified RF-resonance signal is applied to a demodulator 24. The demodulator 24 demodulates the amplified RF-resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF-excitation and refocusing pulses. The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction monitor 26, so that the monitor can display the magnetic resonance image. It is alternatively possible to store the signal from the reconstruction unit 25 in a buffer unit 27 while awaiting further processing.

The magnetic resonance imaging system according to the invention is also provided with a control unit 20, for example in the form of a computer which includes a (micro) processor. The control unit 20 controls the execution of the RF-excitations and the application of the temporary gradient fields. In particular the control unit of the magnetic resonance imaging system according to the invention includes the activation control unit (ACU). The activation control unit is arranged to perform the various functions involved with the RF-excitations. Preferably, these functions are implemented in software and may be incorporated in the computer of the control unit 20. To this end, the computer program according to the invention is loaded, for example, into the control unit 20 and the reconstruction unit 25.

The RF-excitation constituents and their simultaneous emission to achieve the parallelism in the RF-excitation will now be elaborated in some detail. The RF-excitation field has the form of an RF-pulse which follows a certain trajectory in k-space and corresponds to the scanning the RF-energy across k-space. Shortening this trajectory shortens the pulse duration. The use of multiple transmit coils, each with its own time-dependent waveform and spatial emission, compensates for the missing parts of k-space.

Let R be the number of transmit coils of the excitation antennae system with pre-determined, arbitrary spatial RF-emission profiles $S_r(x)$, r=1...R, and unknown individual spatial pulse profiles $P_r(x)$ within the excitation FOV. The superposition of the individual pulse profiles should yield the desired pulse profiles $P_{des}(x)$ $$P_{des}(x) = \sum_{r=1}^{R} S_r(x) P_r(x). \quad (1)$$

Transforming into k-space, Eq. (1) yields $$p_{des}(k(t)) = \sum_{r=1}^{R} s_r(k(t)) \otimes p_r(k(t)). \quad (2)$$

Discretising the time co-ordinate of the k-space trajectories, $p_{des}$ and $p_r$ can be considered as vectors $p_{des}$ and $p_r$ and $s_r$ as matrix $s_r$. This discretisation replaces the convolution by a matrix multiplication $$p_{des}(k(t_v)) = \sum_{r=1}^{R} s_r(k(t_v) - \tilde{k}(t_u)) p_r(\tilde{k}(t_u)). \quad (3)$$

Assuming that the pulse profiles are defined on a N×N matrix in the spatial domain, $p_{des}(k(t_v))$ and $p_r(\tilde{k}(t_u))$ are vectors with $N^2$=M components, and $s_r(k(t_v)-\tilde{k}(t_u))$ has the size M×M. Now the special case of an R-fold reduction of the transmit duration is introduced. Thus the $p_r(\tilde{k}(t_u))$ become vectors with M/R components and $s_r(k(t_v)-\tilde{k}(t_u))$ become rectangular matrices of the size M×M/R. The reduced-sized variables $p_r(\tilde{k}(t_u))$ and $s_r(k(t_v)-\tilde{k}(t_u))$ can be combined to single full-size variables $p_{full}(\tilde{k}(t_w))$ and $s_{full}(k(t_v)-\tilde{k}(t_w))$, w=1...M, by a suitable function w=f(u,r), which takes care of appropriately re-assigning the indices u and r to the new index w, e.g., $$w=u+M(r-1)/R. \quad (4)$$

Thus Eq. (3) can be rewritten as $$p_{des}(k(t_v))=s_{full}(k(t_v)-\hat{k}(t_w))p_{full}(\hat{k}(t_w)). \quad (5)$$

In a simple example where two transmit coils are employed in parallel, R=2 and r=1,2.

Then, in graphical notation, Eq. (5) appears as:

The unknown $p_{full}$ can now be calculated by a straightforward matrix inversion $$p_{full}(\hat{k}(t_w))=s_{full}^{-1}(k(t_v)-\hat{k}(t_w))p_{des}(k(t_v)) \quad (6)$$

or with the help of corresponding regularisation techniques. Next the pulse profiles $p_{des}$ and $p_{full}$ have to be translated into the corresponding waveforms $B_1^{des}$ and $B_1^{full}$.

$$B_1^{des}(t) = D(k(t)) \int_r P_{des}(x) e^{-ixk(t)} dx = D(k(t)) p_{des}(k(t)) \quad (7)$$

$$B_1^{full}(t) = D(k(t)) \int_r P_{full}(x) e^{-ixk(t)} dx = D(k(t)) p_{full}(k(t)).$$

For small flip angle, Eq. (7) is valid in general, for large flip angles, Eq. (7) is valid only for certain k-space trajectories. The function D depends on the k-space trajectory k(t) chosen and is constant for Cartesian k(t). Discretising Eq. (7) in the above described way yields $$B_1^{des}(t_v)=D(k(t_v))p_{des}(k(t_v))$$

$$B_1^{full}(t_w)=D(\hat{k}(t_w))p_{full}(\hat{k}(t_w)) \quad (8)$$

with D(k(t)) a diagonal matrix.

In particular a 2D RF-pulse, starting at time t=0 and ending at t=T, consists of an RF-waveform $B_1(t)$, accompanied by a two-dimensional gradient waveform G(t), which defines a trajectory k(t) through k-space $$k(t) = -\gamma \int_t^T G(s)ds.$$

This definition is in close analogy to that used in the k-space description of imaging sequences. For small flip angles, the resulting spatial distribution of transverse magnetisation $M_t(r)$ can be derived as $$M_t(x) = i\gamma M_o \int_0^T B_1(t)e^{ixk(t)}dt. \quad (9)$$

Here $M_o$ represents the equilibrium longitudinal magnetisation and $\gamma$ denotes the gyromagnetic ratio. Vice versa, the associated $B_1$-waveform to excite a desired pattern $P_{des}(r)$ of transverse magnetisation can be obtained from the 2D Fourier transform of $P_{des}(r)$, sampled along the k-space trajectory. This waveform has to be weighted by the magnitude of the k-space velocity $|\gamma G(t)|$ and the k-space sampling density S(k(t))

$$B_1(t) = \frac{-i|G(t)|}{(2\pi)^2 M_o S(k(t))} \int_r P_{des}(x)e^{-ixk(t)}dr, \quad (10)$$

where the coefficient in front of the integral defines the above introduced D(k(t))

$$D(k(t)) = \frac{-i|G(t)|}{(2\pi)^2 M_o S(k(t))}.$$

Combining Eqs. (6) and (8) leads to $$B_1^{full}(\tilde{k}(t_w)) = D(\tilde{k}(t_w))s_{full}^{-1}(k(t_v) - \tilde{k}(t_w))D^{-1}(k(t_v))B_1^{des}(t_v). \quad (11)$$

Finally the individual waveforms $B_1{}^r(\tilde{k}(t_u))$ has to be separated from $B_1^{full}(\tilde{k}(t_w))$ as defined by Eq. (4).

Note that no assumptions about the full and the reduced k-space trajectories k(t) and $\tilde{k}(t)$ are made. They do not need to be Cartesian. Furthermore, the reduced trajectory $\tilde{k}(t)$ does not need to be part of the full trajectory k(t). Since k(t) is only a virtual trajectory, it even does not need to be physically realisable on the gradient system given. Only $\tilde{k}(t)$ has to fulfil the requirements of the gradient system.

In a simple embodiment two transmit coils are employed and the reduction factor R=2. FIG. 2 shows the chosen desired pulse profile $P_{des}(x)$ and the spatial RF-emission profiles $S_r(x)$, measured on the abdomen of a volunteer. FIG. 3 shows the calculated individual waveforms $B_1{}^r(\tilde{k}(t_u))$ in the excitation k-space (magnitude representation) and corresponding pulse profiles $P_r(x)$ according to Eq. (8). k(t) and $\tilde{k}(t)$ were chosen to be Cartesian (EPI-like), k(t) covering every column and $\tilde{k}(t)$ every second column of k-space. The waveforms $B_1{}^r(\tilde{k}(t_u))$ should now be sent on the different transmit coils while simultaneously the gradient system plays out the reduced k-space trajectory. This experiment is simulated by a numerical study. FIG. 4 shows the individual pulse profiles transmitted with the corresponding coils in the image domain $S_r(x)P_r(x)$ and the Fourier domain $s_r(k(t))$ ⊗ $p_r(k(t))$. It is visible that the convolution in k-space acts as smearing of the data, filling the missing parts of the reduced k-space trajectory $\tilde{k}(t)$. The superposition of $S_1(x)P_1(x)$ and $S_2(x)P_2(x)$ shown in FIG. 4 leads to the desired pulse profile $P_{des}(x)$ shown in FIG. 2.

FIG. 2 shows input for an experiment. Left: the chosen pulse profile $P_{des}(x)$. Centre and right: spatial RF-emission profiles $S_1(x)$ and $S_2(x)$ of the transmit coils, measured on the abdomen of a volunteer.

Figure 1:
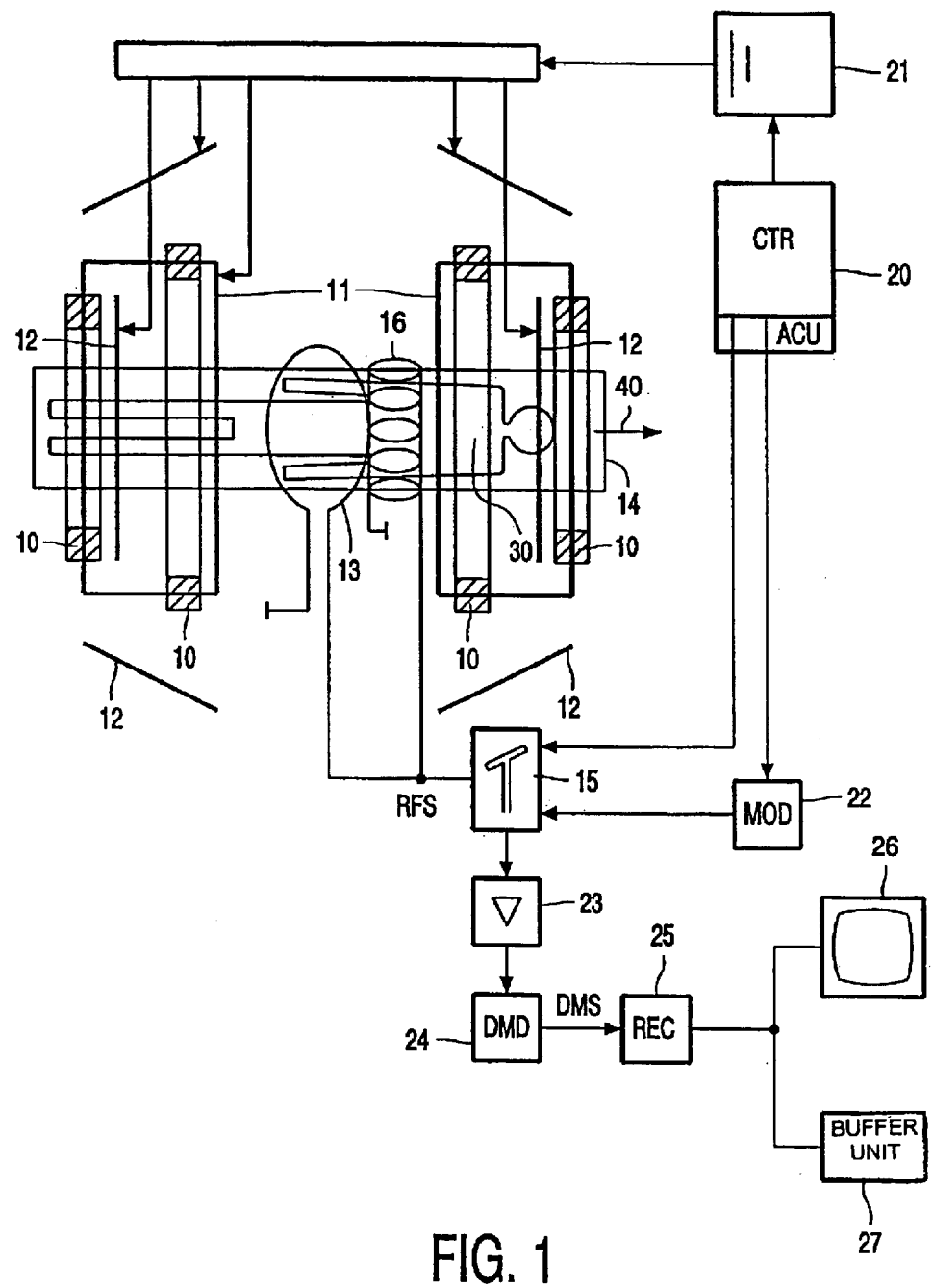
Figure 2:
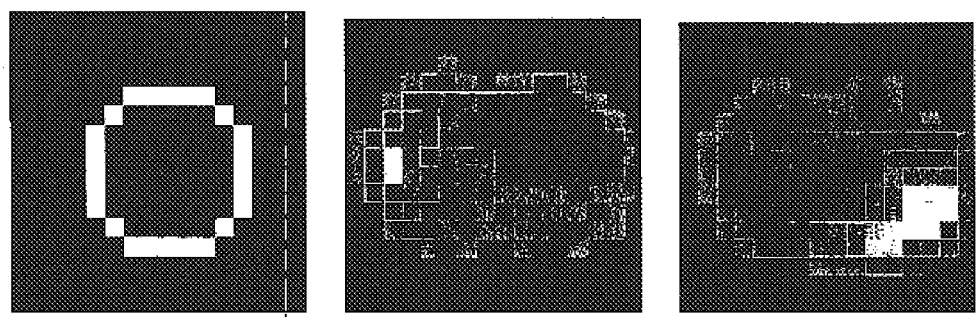
Figure 3:
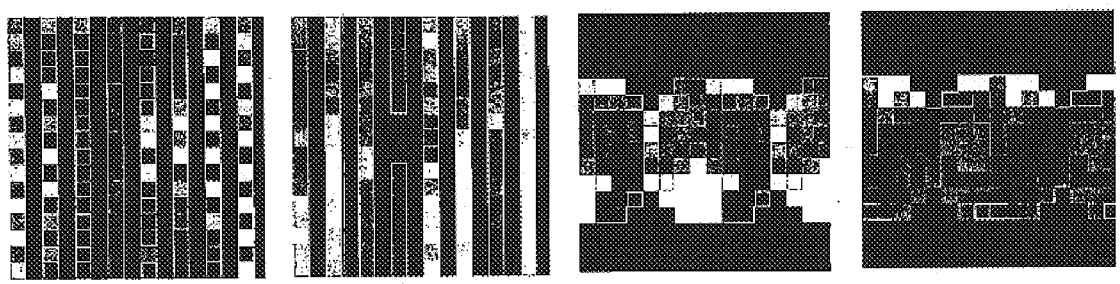
FIG. 3 shows the calculated individual waveforms $B_1{}^r(\tilde{k}(t_u))$ given in magnitude representation (left) and corresponding pulse profiles $P_r(x)$ (right) for the two coils in the spatial domain, assuming homogeneous coil sensitivities. k(t) and $\tilde{k}(t)$ were chosen to be of Cartesian shape, k(t) covers every column and $\tilde{k}(t)$ covers every second column of k-space.
Figure 4:
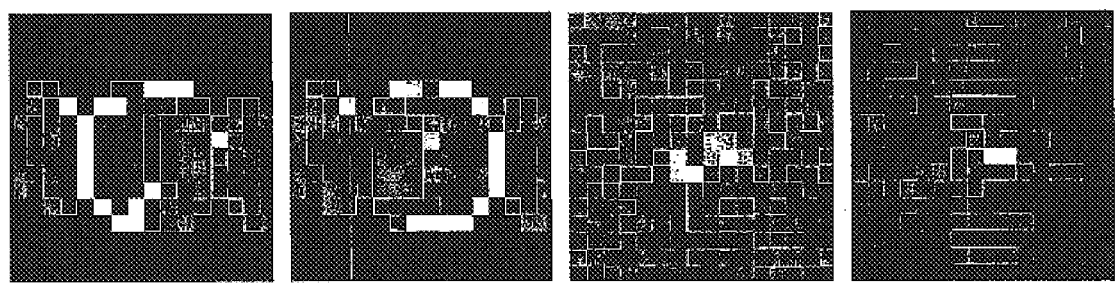
FIG. 4 shows (as numerically simulated results of a corresponding experiment) the individual pulse profiles transmitted with the corresponding coils in the image domain $S_r(x)P_r(x)$ (left) and in the Fourier domain $s_r(k(t))$ ⊗ $p_r(k(t))$ (right). The superposition of the two pulse profiles on the left leads to the desired pulse profile shown on the left in FIG. 2.

The method according to the invention describes the potential of shortening of 2D RF-pulses using multiple transmit coils. The feasibility of the method has been demonstrated in the framework of numerical studies. Further, the method according to the invention may be employed:

to improve the spatial resolution of the pulse profile instead shortening the RF-pulse;

to use a reduction factor lower/higher than the number of coils, as in conventional parallel imaging; and for 3D RF-pulses.

Notably, 3D RF-pulses seem to be a very promising application of this approach. The RF-pulse shortening achieved by simultaneous emission of several RF-excitation constituents can make RF-pulses feasible even in case of fast $T_2{}^*$ relaxing species.

The use of sinusoidal instead arbitrary coil sensitivities simplifies the above described algorithm tremendously.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A magnetic resonance imaging system comprising:

an excitation antennae system including a plurality of antennae for emitting an RF-excitation field [$B_1(t)$]; and an activation control unit coupled to the excitation antennae system which activates the excitation antennae system such that:

individual antennae are activated and simultaneously emit separate non-identical RF-excitation constituents [$B_n(t)$], whereby the RF-excitation constituents having different activation distributions over k-space.

2. A magnetic resonance imaging system as claimed in claim 1, wherein:

the individual antennae have respective spatial RF-emission profiles [$S_n(r)$];

the activation control unit is arranged for:

receiving pre-selected RF-excitation field data [$B_1(t)$];

deriving harmonic components [$s_n[\tilde{k}(t_j)]$] from the individual spatial RF-emission profiles along k-space trajectories; and computing the RF-excitation constituents $[B_n(t)]$ of respective antennae from the RF-excitation field data $[B_1(t)]$ and the harmonic components $s_n[\tilde{k}(t_j)]$ of the individual spatial RF-emission profiles along respective k-space trajectories.

3. A magnetic resonance imaging system as claimed in claim 1, wherein:

the individual antennae have respective spatial RF-emission profiles $[S_n(r)]$; and the activation control unit is arranged for:

receiving pre-selected RF-excitation field data $[B_1(t)]$ which derives aliased spatial profiles for individual antennae;

activating the individual antennae and simultaneously emitting the separate non-identical RF-excitation constituents $[B_n(t)]$ based on the aliased spatial profiles, wherein the aliased spatial profiles have compound local excitation levels that are combined from the pre-selected RF-excitation field data $[B_1(t)]$ and the spatial RF-emission profiles $[S_n(r)]$.

4. A magnetic resonance imaging system as claimed in claim 1, wherein: the individual separate non-identical RF-excitation constituents $[B_n(t)]$ have disjoint supports on k-space.

5. A magnetic resonance imaging system as claimed in claim 2, wherein:

the separate non-identical RF-excitation constituents have activation distributions which cause sub-scanning in at least one sub-scanning directions in k-space; and the spatial RF-emission profiles have their predominant spatial variations along the at least one sub-scanning direction.

* * * * *